United States Patent
Zhang et al.

(10) Patent No.: US 6,420,740 B1
(45) Date of Patent: Jul. 16, 2002

(54) LEAD GERMANATE FERROELECTRIC STRUCTURE WITH MULTI-LAYERED ELECTRODE

(75) Inventors: Fengyan Zhang; Tingkai Li, both of Vancouver; Sheng Teng Hsu, Camas, all of WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/317,780

(22) Filed: May 24, 1999

(51) Int. Cl.$^7$ .................... H01L 29/76; H01L 29/94; H01L 31/062; H01L 31/113; H01L 31/119

(52) U.S. Cl. ................ 257/295; 257/296; 257/306; 257/310

(58) Field of Search .................. 257/295, 296, 257/306, 310

(56) References Cited

U.S. PATENT DOCUMENTS

| | | |
|---|---|---|
| 5,008,687 A | 4/1991 | Longman et al. ........ 346/135.1 |
| 5,708,284 A | 1/1998 | Onishi ..................... 257/295 |
| 5,790,366 A * | 8/1998 | Desu et al. ............... 361/305 |
| 5,793,057 A | 8/1998 | Summerfelt ................ 257/55 |
| 5,807,774 A * | 9/1998 | Desu et al. ............... 438/240 |
| 5,854,107 A | 12/1998 | Park et al. ................ 438/254 |
| 6,097,051 A * | 8/2000 | Torii et al. ................ 257/306 |
| 6,107,136 A * | 8/2000 | Melnick et al. ........... 438/253 |
| 6,146,904 A * | 11/2000 | Hsu et al. ..................... 438/3 |

OTHER PUBLICATIONS

Article entitled, "Improvement of Ta Diffusion Barrier Performance in Cu Metallization by Insertion of a Thin Zr Layer Into Ta Film", by J.S. Kwak and H.K. Baik, published in Applied Physics Letters, vol. 72, No. 22, pp. 2832–2834.

Article entitled, "Investigation of Pt/Ta Diffusion Barrier Using Hybrid Conductive Oxide ($RuO_2$) for High Dielectric Applications" by D–S. Yoon and H. K. Baik, published in J. Vac. Sci. Technol. B 16(3), May/Jun. 1998, pp. 1137–1141.
Article entitled, "Oxidation Resistance of Tantalum–Ruthenium Dioxide Diffusion Barrier for Memory Capacitor Bottom Electrodes" by D–S Y, H.K. Baik, S–M Lee, C–S Park and S–I Lee, published in Applied Physics Letters, vol. 73, No. 3. Jul. 1998, pp. 324–326.
Article entitled, "Oxide ($CeCo_2$)–incorporated new diffusion barrier for Cu metallization" by D–S Yoon, S–M Lee and H. K. Baik, published in 1998 Materials Research Society, Conference Proceedings ULSI XIII, pp. 103–109.

* cited by examiner

Primary Examiner—Jerome Jackson, Jr.
Assistant Examiner—Jesse A. Fenty
(74) Attorney, Agent, or Firm—David C. Ripma; Matthew D. Rabdau; Scott C. Krieger (57) ABSTRACT

The ferroelectric structure including a Pt/Ir layered electrode used in conjunction with a lead germanate ($Pb_5Ge_3O_{11}$) thin film is provided. The electrode exhibits good adhesion to the substrate, and barrier properties resistant to oxygen and lead. Ferroelectric properties are improved, without detriment to the leakage current, by using a thin $IrO_2$ layer formed in situ, during the MOCVD lead germanate ($Pb_5Ge_3O_{11}$) thin film process. By using a Pt/Ir electrode, a relatively low MOCVD processing temperature is required to achieve c-axis oriented lead germanate ($Pb_5Ge_3O_{11}$) thin film. The temperature range of MOCVD caxis oriented lead germanate ($Pb_5Ge_3O_{11}$) thin film on top of Pt/Ir is 400–500° C. Further, a relatively large nucleation density is obtained, as compared to using single-layer iridium electrode. Therefore, the lead germanate ($Pb_5Ge_3O_{11}$) thin film has a smooth surface, a homogeneous microstructure, and homogeneous ferroelectric properties. A method of forming the above-mentioned multi-layered electrode ferroelectric structure is also provided.

18 Claims, 6 Drawing Sheets

Fig. 2(a) RTP AT 550°C FOR 5 MIN.

Fig. 2(b) RTP AT 650°C FOR 5 MIN.

Fig. 3(a)

PGO ON Pt ELECTRODE
T DEPOSITION = 450°C, T VAPORIZER = 150°C
FLOW RATE = 0.4 sccm, CHAMBER PRESSURE = 10 Torr

Fig. 3(b)

PGO ON Ir ELECTRODE
T DEPOSITION = 530°C, T VAPORIZER = 190°C
FLOW RATE = 0.4 sccm, CHAMBER PRESSURE = 10 Torr

Fig. 3(c)

PGO ON Pt/Ir ELECTRODE
T DEPOSITION = 480°C, T VAPORIZER = 150°C
FLOW RATE = 0.4 sccm, CHAMBER PRESSURE = 10 Torr Fig. 4(a) PGO THIN FILM GROWN ON Pt/Tin ELECTRODE Fig. 4(b) PGO THIN FILM GROWN ON Ir/Ti ELECTRODE Fig. 4(c) PGO THIN FILM GROWN ON Pt/Ir/Ti ELECTRODE

LEAD GERMANATE FERROELECTRIC STRUCTURE WITH MULTI-LAYERED ELECTRODE

BACKGROUND AND SUMMARY OF THE INVENTION

The present invention is generally related to the fabrication of integrated circuits (ICs) and, more specifically, to the fabrication of a lead germanate ferroelectric structure having an electrode of layered noble metals.

Platinum (Pt) and other noble metals are used in IC ferroelectric capacitors. The use of noble metals is motivated by their inherent chemical resistance. This property is especially desirable under high temperature oxygen annealing conditions, such as those seen in the fabrication of ferroelectric capacitors. In addition, chemical interaction between noble metals and ferroelectric materials such as perovskite metal oxides, is negligible.

The above-mentioned noble metals are used as conductive electrode pairs separated by a ferroelectric material. One, or both of the electrodes are often connected to transistor electrodes, or to electrically conductive traces in the IC. As is well known, these ferroelectric devices can be polarized in accordance with the voltage applied to the electrode, with the relationship between charge and voltage expressed in a hysteresis loop. When used in memory devices, the polarized ferroelectric device can be used to represent a "1" or a "0". These memory devices are often called ferro-RAM, or FeRAM. Ferroelectric devices are nonvolatile. That is, the device remains polarized even after power is removed from the IC in which the ferroelectric is imbedded.

There are problems in the use of metal, even noble metal electrodes. Pt, perhaps the widely used noble metal, permits the diffusion of oxygen, especially during high temperature annealing processes. The diffusion of oxygen through Pt results in the oxidation of the neighboring barrier and substrate material. Typically, the neighboring substrate material is silicon or silicon dioxide. Oxidation can result in poor adhesion between the Pt and neighboring layer. Oxidation can also interfere with the conductivity between neighboring substrate layers. Silicon substrates are especially susceptible to problems occurring as a result of oxygen diffusion. The end result may be a ferroelectric device with degraded memory properties. Alternately, the temperature of the IC annealing process must be limited to prevent the degradation of the ferroelectric device.

Various strategies have been attempted to improve the interdiffusion, adhesion, and conductivity problems associated with the use of noble metals as a conductive film in IC fabrication. Titanium (Ti), titanium oxide ($TiO_2$), and titanium nitride (TiN) layers have been interposed between a noble metal and silicon (Si) substrates to suppress the interdiffusion of oxygen. However, Ti layers are generally only effective below annealing temperatures of 600 degrees C. After a 600 degree C annealing, Pt diffuses through the Ti layer to react with silicon, forming a silicide product. Further, the Pt cannot stop the oxygen diffusion. After a high temperature annealing, a thin layer of silicon oxide may be formed on the silicon surface, which insulates contact between silicon and the electrode.

Other problems associated with the annealing of a Pt metal film are peeling and hillock formation. Both these problems are related to the differences in thermal expansion and stress of Pt with neighboring IC layers during high temperature annealing. A layer of Ti overlying the Pt film is known to reduce stress of the Pt film, suppressing hillock formation.

Ir has also been used in attempts to solve the oxygen interdiffusion problem. Ir is chemically stable, having a high melting temperature. Compared to Pt, Ir is more resistant to oxygen diffusion. Further, even when oxidized, iridium oxide remains conductive. When layered next to Ti, the Ir/Ti barrier is very impervious to oxygen interdiffusion. However, Ir can diffuse through Ti. Like Pt, Ir is very reactive with silicon or silicon dioxide. Therefore, a bilayered Ir/Ti or Ir/TiN barrier is not an ideal barrier metal.

$Pb_5Ge_3O_{11}$ is a promising ferroelectric material candidate for nonvolatile memory, such as one-transistor (1T) applications, because of its moderate polarization and relative low dielectric constant. But, this material is a low symmetry ferroelectric material, and it is widely believed that spontaneous polarization exists only along the c-axis. Furthermore, in the PbO—$GeO_2$ system, the stability range for the $Pb_5Ge_3O_{11}$ phase is very limited. Even a relatively small deviation in composition, or in growth temperature, can lead to the formation of other lead germanate (PGO) compounds, or phases. Therefore, successful use of this ferroelectric material is dependent upon deposition processes and the adjoining electrode material.

A suitable bottom electrode is required for depositing useful lead germanate ($Pb_5Ge_3O_{11}$) ferroelectric thin films. The bottom electrode must have good adhesion with the substrate, good electrical conductivity, and good barrier properties with respect to oxygen and lead. A good bottom electrode must also improve the fatigue degradation, and reduce the leakage current, of the lead-based ferroelectric thin film. From the processing point of view, the bottom electrode should provide a preferred nucleation and growth surface for the c-axis oriented lead germanate ($Pb_5Ge_3O_{11}$) thin film at a relative low MOCVD temperature.

Single-layer platinum is widely used as the bottom electrode in PZT and SBT based nonvolatile ferroelectric memories. However, oxygen and elements such as lead can easily diffuse through Pt and react with barrier layers (Ti, TiN) and/or the substrate (Si or $SiO_2$), all of which are susceptible to oxidation. Deleterious oxidation leads to bad adhesion with the substrate, a poor interface between platinum and ferroelectric layers, and a poor interface between platinum and the substrate layers.

Further, severe fatigue is an inherent problem associated with ferroelectric thin films, which is not improved by using a single-layer platinum electrode. Fatigue degradation is thought to be due to the domain pinning by space charge, caused by oxygen vacancy entrapment at the interface between the ferroelectric film and the electrode. It is believed that fatigue properties can be significantly improved by using a conducting oxide electrode to prevent space charge formation at the interface. Finally, hillocks are typically found on the surface of single-layer platinum electrodes during depositing of ferroelectric thin film. The hillocks are caused by stress internal to the platinum film. Hillocks result in increased leakage currents, or even device shorts.

Single-layer iridium bottom electrodes are also used in PZT and SBT based devices. Iridium bottom electrodes have superior barrier properties with respect to lead and oxygen, as well as good adhesion with the substrate. However, higher process temperatures are required for MOCVD c-axis oriented lead germinate ($Pb_5Ge_3O_{11}$) thin films deposition processes, comparing to the platinum electrode. The MOCVD temperature range to deposit c-axis oriented lead germanate ($Pb_5Ge_3O_{11}$) thin film on the Ir electrode is 500–600° C. Further, a lower nucleation site density causes a very rough lead germanate ($Pb_5Ge_3O_{11}$) thin film surface, as compared to the film deposited on platinum electrode. Finally, hillock formation on the surface of the iridium electrode is still observed during MOCVD processing.

Metal oxide electrodes such as $RuO_2$ are used for PZT based nonvolatile memory to improve the fatigue degradation. But $RuO_2$ electrodes cause an increase in the leakage current. An oxide/platinum double-layer electrode reduces the leakage current, and improves the barrier properties and hillock problem. However, the leakage current is still larger than that of using a single-layer platinum electrode. Further, a thicker oxide layer is formed, resulting in a higher sheet resistance.

Several other oxygen barrier layers exist including a conductive exotic-nitride layer underneath a platinum layer (Ti—Al—N), a noble-metal-insulator-alloy barrier layer (pd-Si—N), and similar variations. These oxide barriers require more complicated process steps and a multilayer electrode in order to meet the requirement for a bottom electrode. A $Pt/IrO_2$ electrode is used in SBT based devices. However, the Pt/IrO2 electrode is not very suitable for lead-based thin films. This is because a thin oxide layer is still needed between the ferroelectric film and the platinum electrode in order to improve the fatigue degradation.

Co-pending application Ser. No. 09/263,595, entitled "Iridium Conductive Electrode/Barrier Structure and Method for Same", invented by Zhang et al., and filed on Mar. 5, 1999, discloses a multilayered Ir/Ta film that is resistant to interdiffusion.

Co-pending application Ser. No. 09/263,970, entitled "Iridium Composite Barrier Structure and Method for Same", invented by Zhang et al., and filed on Mar. 5, 1999, discloses a composite Ir film that is resistant to interdiffusion, and stable during high temperature annealing.

Co-pending application Ser. No. 09/316,646, entitled "Composite Iridium Barrier Structure with Oxidized Refractory Metal Companion Barrier and Method for Same", invented by Zhang et al., and filed on May 21, 1999, discloses a Ir composite film with an oxidized transitional metal barrier layer that maintains conductivity and structural stability after high temperature annealing in an oxygen environment.

Co-pending application Ser. No. 09/316,661, entitled "Composite Iridium-Metal-Oxygen Barrier Structure with Refractory Metal Companion Barrier and Method for Same", invented by Zhang et al., and filed on May 21, 1999, discloses a Ir composite film that maintains conductivity and structural stability after high temperature annealing in an oxygen environment.

In co-pending patent application Ser. No. 09/301,435, entitled "Multi-Phase Lead Germanate Film and Deposition Method", invented by Tingkai Li et al., filed on Apr. 28, 1999, a second phase of $Pb_3GeO_5$ is added to the $Pb_5Ge_3O_{11}$, increasing polycrystalline grain sizes, without c-axis orientation. The resultant film had increased Pr values and dielectric constants, and decreased Ec values. Such a film is useful in making microelectromechanical systems (MEMS), high speed multichip modules (MCMs), DRAMs, and FeRAMs, In co-pending patent application Serial No. 09/301,420, entitled "C-Axis Oriented Lead Germanate Film and Deposition Method", invented by Tingkai Li et al., filed on Apr. 28, 1999, a PGO film is disclosed. This film has primarily a c-axis orientation with a smaller Pr value, smaller dielectric constant, and larger Ec value. Such a film is useful in making 1T memories.

In co-pending patent application Ser. No. 09,302,272, entitled "Epitaxially Grown Lead Germanate Film and Deposition Method", invented by Tingkai Li et al., filed on Apr. 28, 1999, an epitaxial grown PGO film is disclosed with extremely high c-axis orientation. As a result, high Pr and Ec values, as well as lower dielectric constant, is obtained. Such a film is useful in 1T, and one transistor/one capacitor (1T/1C) FeRAM applications.

In co-pending patent application Ser. No. 09/301,434, entitled "Ferroelastic Lead Germanate Thin Film and Deposition Method", invented by Tingkai Li et al., filed on Apr. 28, 1999, a CVD $Pb_3GeO_5$ film is described having improved ferroelastic properties useful in making MEMS and MCMs. The above-mentioned co-pending patent applications are incorporated herein by reference.

It would be advantageous if a ferroelectric electrode could be fabricated that incorporated the best features of Ir and Pt.

It would be advantageous if alternate methods were developed for the use of Ir and/or Pt as conductors, conductive barriers, or electrodes in IC fabrication. It would be advantageous if the Ir and Pt could be used without interaction to an underlying Si substrate.

It would be advantageous if an Ir or Pt film could be altered to improve interdiffusion properties. Further, it would be advantageous if this improved type of Ir or Pt film could be layered with an interposing film to prevent the interaction of Ir or Pt with a silicon substrate. It would be advantageous if an interposing film could prevent interdiffusion between the electrode and the ferroelectric material.

Accordingly, a ferroelectric device is provided comprising a silicon substrate, a first electrode layer of Ir overlying the substrate, and a second electrode layer of Pt overlying the first electrode layer. The first and second electrode layers have a combined thickness of about 100 to 400 nm, and are used to improve adhesion, barrier properties, and the uniformity of the PGO film.

A first barrier layer of $IrO_2$ overlies the second electrode layer, to improve the interface to PGO film, and limit the diffusion of oxygen into the first and seconds electrode layers. A lead germanate (PGO) film having a $Pb_5Ge_3O_{11}$ phase of about 10 to 100% overlies the first barrier layer. Optionally, the PGO film is epitaxially grown $Pb_5Ge_3O_{11}$ phase. In this manner, a ferroelectric device is formed having low leakage current and a resistance to fatigue.

A second barrier layer of a material such as Ti, Ta, TiN, TaN, or a ternary nitride including nitrogen and a refractory metal, such as TiSiN or TaSiN, having a thickness of about 10 to 100 nanometers (nm), is interposed between the substrate and the first electrode layer to minimize interdiffusion between the substrate and the electrode layers. Further, adhesion between the substrate and the electrode layers is improved by using the second barrier.

Ultimately, the ferroelectric device forms a capacitor with the addition of a conductive film top electrode overlying the PGO film. The top electrode optionally comprises a third Pt electrode layer overlying the PGO film, and a fourth Ir electrode layer overlying the third electrode layer to form a second layered electrode. When a layered top electrode is used, a third barrier layer is interposed between the PGO film and the third electrode layer to improve the interface with the underlying PGO film.

Also provided is a method of forming a ferroelectric device on a substrate comprising the steps of:

a) forming the Ir electrode layer overlying the substrate to a thickness of approximately 150 nm.;

b) forming the Pt electrode layer overlying the first electrode layer to a thickness of approximately 50 nm.;

c1) forming a first $IrO_2$ barrier layer overlying the second electrode layer to a thickness of approximately 15 nm; and c2) forming a second barrier layer of selected from the group consisting of consisting of Ti, Ta, TiN, TaN, and ternary nitrides including nitrogen and a refractory metal, interposed between the substrate and the first electrode layer, having a thickness of approximately 25 nm;

d) forming a PGO layer overlying the first barrier layer film, to a thickness in the range of approximately 100–200 nm, through MOCVD processes at a temperature in the range of approximately 400 to 550 degrees C.

There are three different processes for forming the first barrier layer. In one process, Step c1) includes annealing the first and second electrode layers to form a first barrier layer oxide overlying the second electrode layer. In a second process, Step c1) includes using processes selected from the group consisting of PVD, CVD, and MOCVD to deposit a first barrier layer of $IrO_2$. In a third process, Step c1) includes forming $IrO_2$ in preparation for an MOCVD process in Step d), by preflowing oxygen at a flow rate in the range of approximately 2000 to 4000 sccm, at a growth chamber pressure of approximately 10 torr, a substrate temperature in the range of approximately 400 to 550 degrees C, for a duration of approximately 10 to 15 minutes, whereby the first barrier layer is formed in situ.

Steps a) and b) includes depositing the first and second electrode layers through processes selected from the group consisting of e-beam evaporation, CVD, PVD, and MOCVD, at a temperature in the range of approximately 200–300 degrees C.

When a capacitor is formed, further steps following Step d), of:

d1) forming a third barrier layer of $IrO_2$ overlying the PGO film formed in Step d), whereby the interface between the PGO film and the third and fourth electrode layers is improved;

e) forming a third electrode layer overlying the PGO film; and f) forming a fourth electrode layer overlying the third electrode layer, whereby a ferroelectric capacitor is formed.

DETAILED DESCRIPTION OF THE PREFERRED EMBODIMENT $Pb_5Ge_3O_{11}$ phase PGO has a relative low dielectric constant of about 50, contrasted to 1000 for PZT, and 300 for SBT. A low dielectric constant is a key factor in lowering the programming voltage for one-transistor memory applications. Lead germanate is a low symmetry ferroelectric material. Spontaneous polarization occurs only along one axis (c-axis) at a value of around 3–5 $\mu C/cm^2$. Its Curie temperature is around 177° C. Many methods have been used to grow lead germanate thick films, such as rapid-quenching, printing, thermal evaporation, flash-vaporation, pulsed excimer laser ablation, dc reactive sputtering, and sol gel.

The present invention discloses the formation of a lead germanate thin film through metal organic chemical vapor deposition (MOCVD) on a Pt/Ir bottom electrode.

Experimental Data

The lead germanate thin films were grown on Pt/TiN/$SiO_2$/Si, Ir/Ti/$SiO_2$/Si and Pt/Ir/Ti/$SiO_2$ electrodes through MOCVD processes. A liquid delivery system was used to deliver $[Pb(thd)_2]$ and $[Ge(ETO)_4]$ precursors to the growth chamber. The temperature of the vaporizer was about 150–200° C. The molar ratio of $[Pb(thd)_2]$ to $[Ge(ETO)_4]$ was around 5:3 and the substrate temperature was about 400–600° C. The growth chamber pressure was varied from 2–20 torr. The Ar and $O_2$ flow rates were 4000 standard cubic centimeters per minute (sccm) and 2000 sccm, respectively. The properties of electrodes were investigated by sheet resistance measurement and Auger electron microscope (AES) analysis. The microstructures and phases of the PGO thin films were determined by scanning electron microscope (SEM) and X-ray diffraction (XRD), respectively. The chemical compositions of the films were determined by energy-dispersive X-ray spectroscope (EDX). The leakage currents and dielectric constants of the films were measured using HP 4155-6 precision semiconductor parameter analyzer and Keithley 182 CV analyzer, respectively. The ferroelectric properties of the films were measured by a standard RT66A tester.

Results show that PGO film deposited on a Pt bottom electrode tends to be more uniform, while the temperature required for c-axis orientation PGO thin film is lower (450–500° C.). However, secondary phases are more easily to form on Pt substrate at lower temperatures. On the other hand, a PGO thin film deposited on an Ir electrode is rougher due to the low nucleation density, and the $Pb_5Ge_3O_{11}$ phase tends to be random oriented when the deposition temperature is around 400–500° C. By increasing the deposition temperature, c-axis oriented PGO thin film can be obtained, but a large grain size $Pb_3GeO_5$ secondary phase is also formed.

An Ir/Ti electrode has better adhesion than Pt/Ti, Pt/TiO2 or Pt/TiN electrodes. Therefore, to combine the advantages of electrode surface smoothness, PGO film uniformity, resistive barrier properties, and adhesion, a layer of Pt was deposited on the Ir/Ti.

Figure 1A:
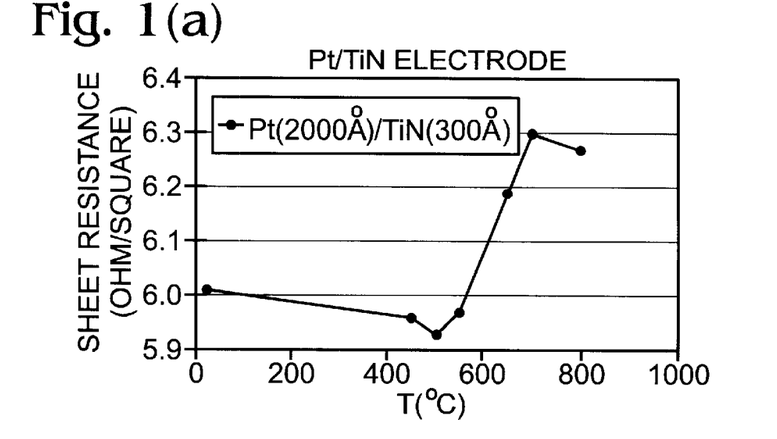
FIGS. 1(a)–(c) illustrate the sheet resistance changes of Pt/TiN, Ir/Ti, and Pt/Ir/Ti electrodes upon rapid thermal process (RTP) annealing.
Figure 1B:
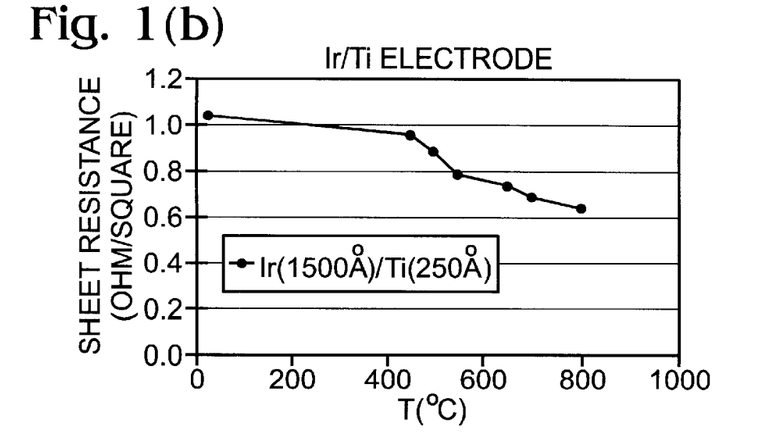
Figure 1C:
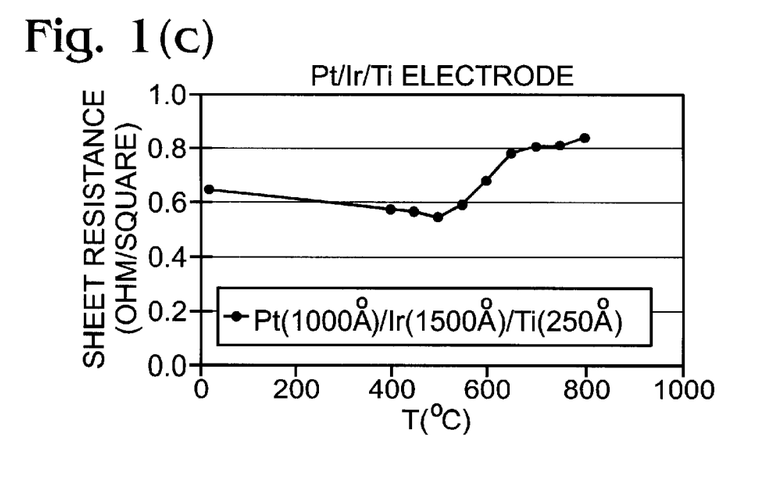

FIGS. 1(a)–(c) illustrate the sheet resistance changes of Pt/TiN, Ir/Ti, and Pt/Ir/Ti electrodes upon rapid thermal process (RTP) annealing. The sheet resistance of the Pt/TiN electrode decreases slightly at temperatures below 550° C., and then increases until 750° C., where the TiN layer begins to oxidize. Similar results are obtained with a Pt/Ti electrode. However, the sheet resistance of the Ir/Ti electrode decreases until 800° C. annealing temperatures are achieved, indicating that grain growth of Ir crystals and further oxidation of the barrier layer have ceased. With respect to the Pt/Ir/Ti electrode, sheet resistance decreases until 550° C., and then increases, which is an indication of further oxidation of the barrier layer.

Figure 2A:
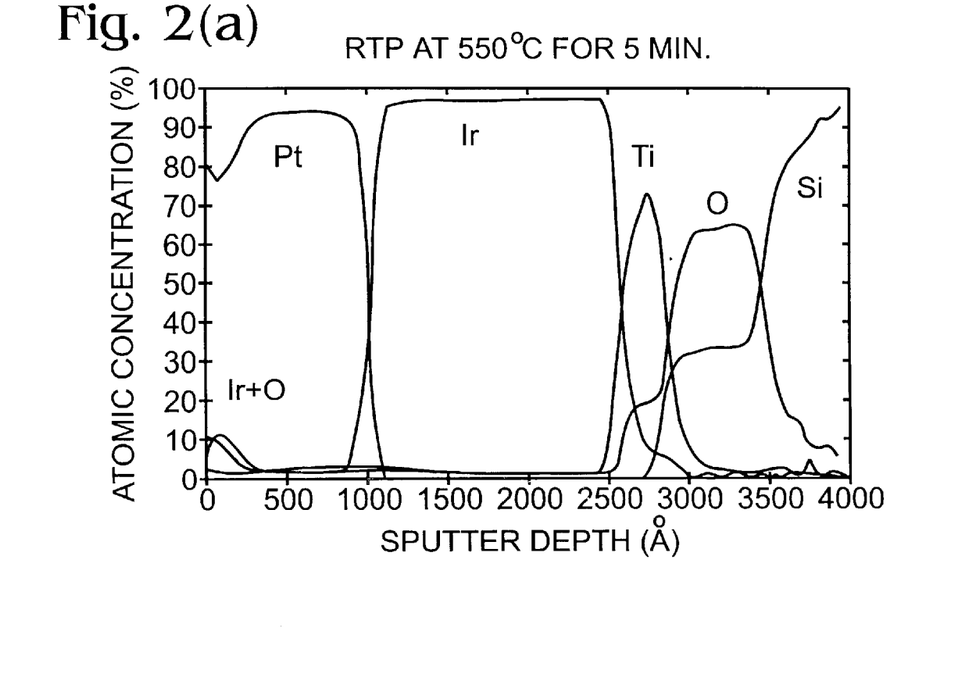
FIGS. 2(a) and 2(b) illustrate the AES analysis of present invention electrode depth profiles annealed at different temperatures.
Figure 2B:
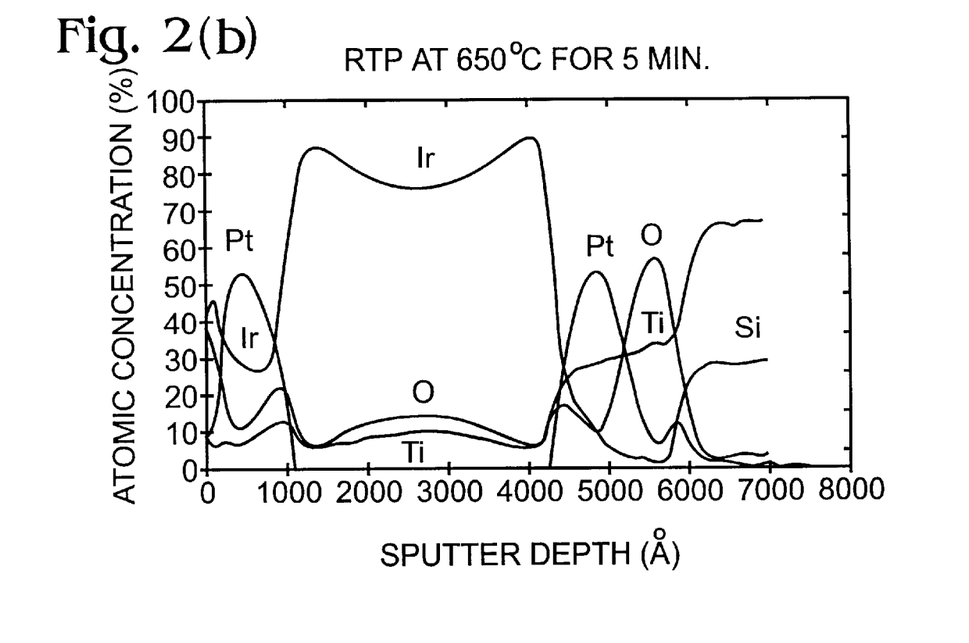

FIGS. 2(a) and 2(b) illustrate the AES analysis of present invention electrode depth profiles annealed at different temperatures. In order to investigate the oxidation mechanism of the Pt/Ir/Ti electrode, samples were annealed at 550° C. and 650° C. From the AES spectrum of FIG. 2(b) it can be seen that after 650° C. annealing, in $O_2$ for 5 minutes, interdiffusion has occurred between Ir and Pt layers. Simultaneously, the Ti layer has been oxidized. Therefore, it is believed that the interdiffusion of Pt and Ir can degrade the barrier properties of the Ir layer. During high temperature annealing Ti out-diffuses through the Pt/Ir layer, while oxygen in-diffuses through the Pt/Ir layer, causing total oxidation of the Ti layer.

On the other hand, the sample annealed at 550° C. has no apparent interdiffusion between all Pt/Ir/Ti layers, as shown on FIG. 2(a). This indicates that the electrode remains stable if annealed at temperatures below 550° C. However, it can be seen that small amounts of $IrO_2$ still appear on the surface of the Pt layer. The $IrO_2$ changes the surface condition for the subsequent deposition of PGO thin films.

Figure 3A:
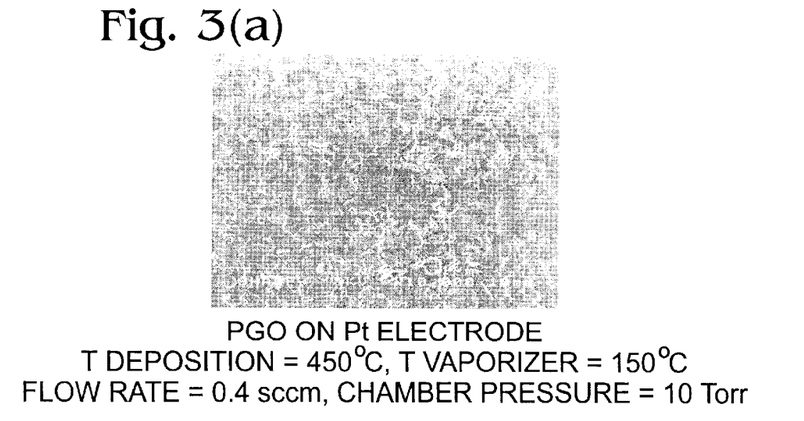
FIGS. 3(a)–(c) illustrate the microstructures of PGO thin films deposited on three electrodes, including one electrode of the present invention.
Figure 3B:
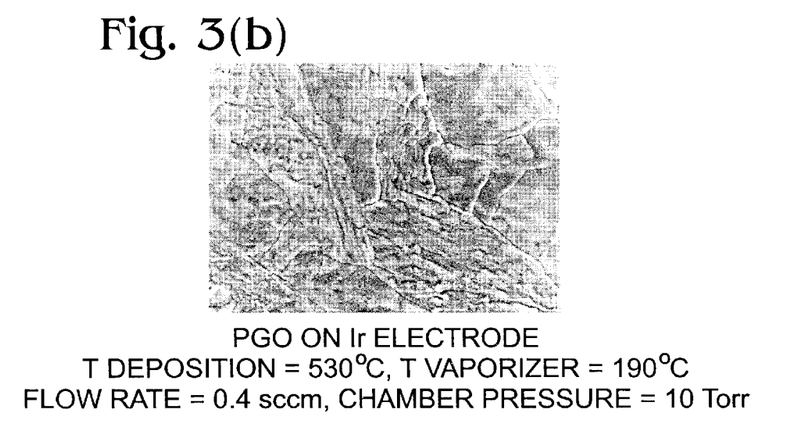
Figure 3C:
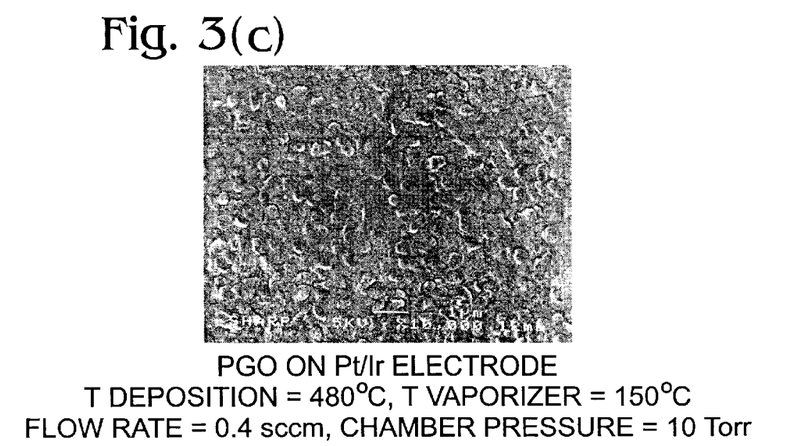

FIGS. 3(a)–(c) illustrate the microstructures of PGO thin films deposited on three electrodes, including one electrode of the present invention. It can be seen from FIG. 3(a) that the PGO film deposited on Pt electrode is very uniform and exhibits layered growth. The film is continuous, which means the nucleation density is high. The XRD data shows that the film is c-axis oriented $Pb_5Ge_3O_{11}$ phase, plus some $Pb_3GeO_5$ secondary phase. The processing temperature for depositing c-axis oriented PGO thin film on Pt electrode is typically around 400–500 ° C.

FIG. 3(b) illustrates that the PGO thin film deposited on Ir substrate is rougher. XRD data indicates that it is polycrystalline $Pb_5Ge_3O_{11}$ phase with preferred c-axis orientation and some $Pb_3GeO_5$ secondary phase. The rough PGO film on Ir electrode is caused by low nucleation density and high processing temperature (500–600° C.). In order to improve the PGO film quality on Ir substrate, two-step deposition process has been developed. A first step deposits a thin layer of PGO film at 400–450° C. to get high nucleation density. A second step deposits PGO film continuously at higher temperature, about 500–600° C., to get c-axis oriented PGO film. Continuous and smoother films can be obtained by two-step deposition. Since the second step is performed at higher temperatures, large grain size $Pb_3GeO_5$ secondary phase is hard to avoid.

FIG. 3(c) is a pure c-axis oriented PGO thin film deposited on Pt/Ir substrate. The process temperature used to deposit a PGO film on a Pt/Ir electrode is in between the temperatures used to deposit PGO film on either Pt or Ir electrodes. Likewise, the uniformity of the PGO film deposited on the Pt/Ir electrode is in between those of the films deposited on Ir and Pt electrodes. This is due to the interdiffusion of Pt and Ir. Small amount of $IrO_2$ on the Pt surface change the surface condition of Pt/Ir electrode. Further, the adhesion of the Pt/Ir/Ti is found to be better than Pt/Ti, Pt/TiN and Pt/$TiO_2$ electrodes.

Figure 4A:
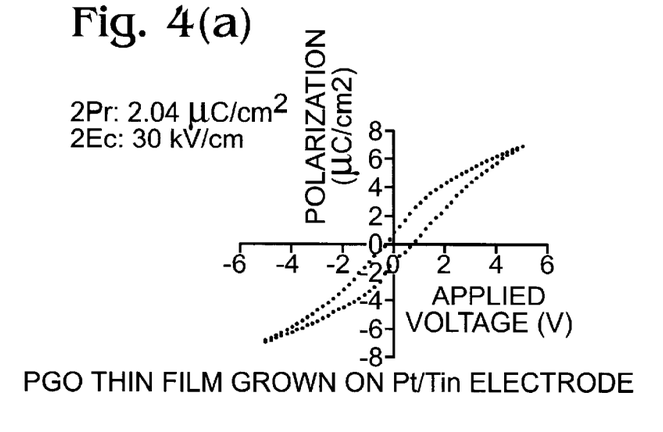
FIGS. 4(a)–(c) illustrate the ferroelectric properties of $Pb_5Ge_3O_{11}$ thin films on the three electrodes of FIGS. 3(a)–(c), following the deposition of Pt top electrodes.
Figure 4B:
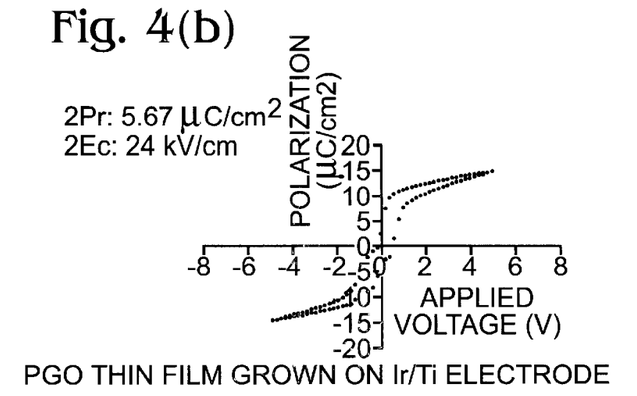
Figure 4C:
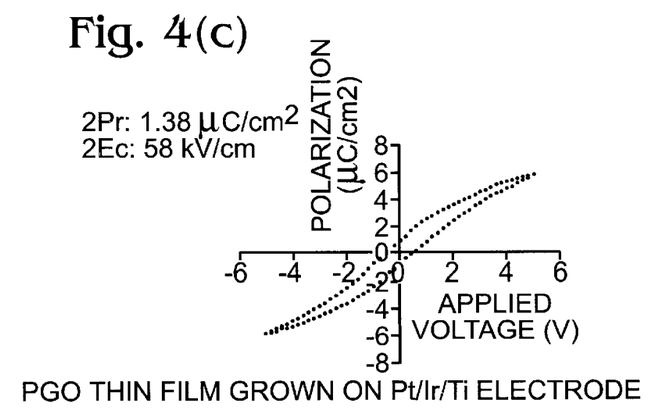

FIGS. 4(a)–(c) illustrate the ferroelectric properties of $Pb_5Ge_3O_{11}$ thin films on the three electrodes of FIGS. 3(a)–(c), following the deposition of Pt top electrodes. The PGO film deposited on the Pt bottom electrode has a 2 Pr (polarization field) about 2.04 micro-coulombs per square centimeter ($\mu C/cm^2$), as shown on FIG. 4(a), with leakage current about $4.5 \times 10^{-7}$ amps per square centimeter ($A/cm^2$) at 100 kilovolts per centimeter (kV/cm), and dielectric constant about 50.

The grain size of the PGO film deposited on Ir substrate, at higher temperatures, is larger than that of the PGO film deposited on Pt electrode. Its 2Pr is higher at about 5.67 $\mu C/cm^2$, with a leakage current $2 \times 10^{-6}$ $A/cm^2$ at 100 kV/cm, and a dielectric constant about 100. However, as seen in FIG. 4(b), the hysteresis loop has been distorted by the $Pb_3GeO_5$ secondary phase.

The film deposited on Pt/Ir electrode has a smaller grain size than that of the PGO films deposited on Pt and Ir electrodes. Its 2Pr is about 1.38 $\mu C/cm^2$, with a leakage current of $3.6 \times 10^{-7}$ $A/cm^2$ at 100 kV/cm, and dielectric constant close to 45. FIG. 4(c) illustrates that the remanent polarization of the PGO thin films strongly depend on the grain size. On the other hand, leakage current depends on both the PGO film quality and the properties of the electrodes.

Figure 5:
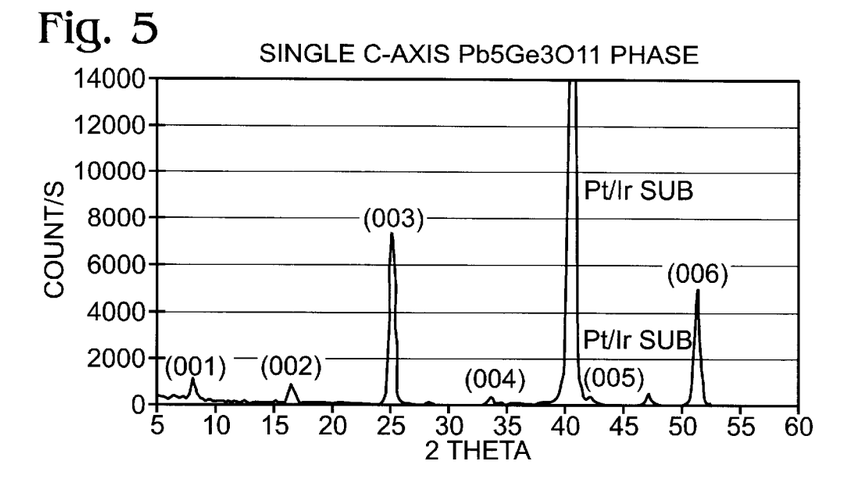
FIG. 5 illustrates XRD data of single phase $Pb_5Ge_3O_{11}$ grown on the electrode of FIG. 3(c), the multi-layered electrode of the present invention.

FIG. 5 illustrates XRD data of the single phase $Pb_5Ge_3O_{11}$ grown on the electrode of FIG. 3(c), the multi-layered electrode of the present invention. The XRD data indicates that the film is pure (single phase) c-axis oriented $Pb_5Ge_3O_{11}$ film.

The Pt/Ir electrode can be deposited on the substrate by using e-beam evaporation, CVD, PVD or MOCVD methods. The first step is optional, depositing a thin layer of Ti, preferably 25 nm thick. The second step is to consecutively deposit the iridium and platinum layers. All these deposition are performed at a preferred temperature range of 200–300° C.

The thin IrO2 layer can be formed in situ with the MOCVD process before the deposition of the PGO film. The chamber is first stabilized by pre-flowing oxygen into the MOCVD growth chamber at a wafer temperature of 400–550° C., with a 2000–4000 sccm flow rate, for few minutes just before the precursor is introduced to deposit lead germanate thin film. C-axis oriented lead germanate ($Pb_5Ge_3O_{11}$) thin film with a thickness of about 100 to 500 nm is obtained at a wafer temperature of 400–550° C. A top platinum electrode, iridium electrode, or $IrO_2$ electrode is deposited to form a ferroelectric capacitor.

The thickness of the $IrO_2$ can be kept to a thickness of about 10 to 30 nm. This thickness is sufficient to improve the fatigue characteristics, while thin enough to promote a very small leakage current and conductive the bottom electrode.

Figure 6:
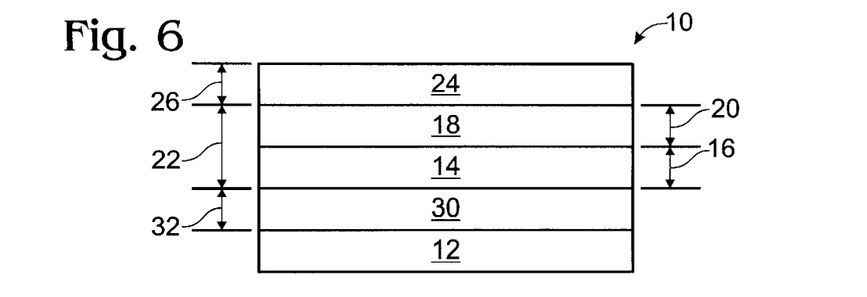
FIGS. 6–8 illustrate steps in the completion of the ferroelectric device of the present invention.
Figure 7:
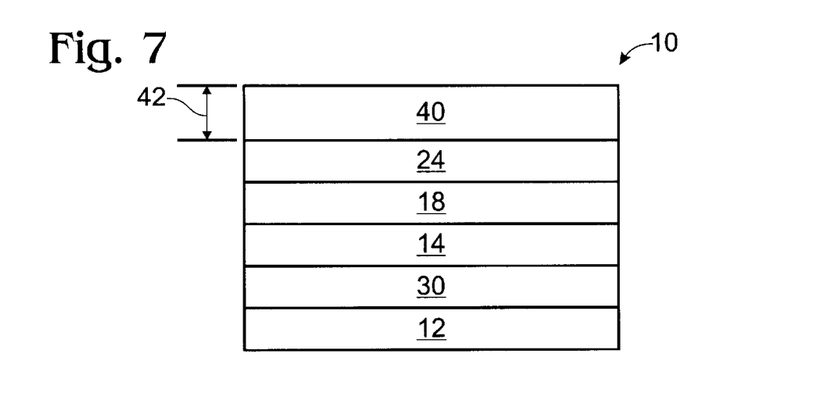
Figure 8:
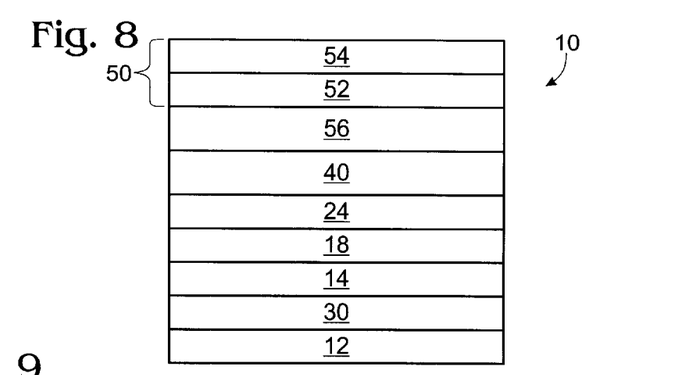

FIGS. 6–8 illustrate steps in the completion of the ferroelectric device of the present invention. FIG. 6 shows ferroelectric device 10 including a substrate 12. Substrate 12 is selected from the group of materials consisting of silicon, polysilicon, silicon dioxide, and silicon-germanium compounds. A first electrode layer 14, including a noble metal, overlies substrate 12. Typically, first electrode layer 14 is Ir, with a thickness 16 in the range of approximately 50 to 200. A thickness range of about 100 to 200 nm is preferred, with 150 nm being optimal in some circumstances.

A second electrode layer 18, including a noble metal, overlies first electrode layer 14. First 14 and second 18 electrode layers improve adhesion, barrier properties, and the uniformity of subsequently deposited films. Typically, second electrode layer 18 is Pt, with a thickness 20 in the range of approximately 10 to 200 nm. A thickness of about 10 to 150 nm is preferred, with 50 nm being optimal in some aspects of the invention. First and second electrodes 14/18 have a combined thickness 22 in the range of approximately 100 to 400 nm, with 200 nm being optimal in some aspects of the invention.

A first barrier layer 24 overlies second electrode layer 18. First barrier layer 24 improves the interface to subsequently deposited layers, and limits the diffusion of oxygen into first and seconds electrode layers 14/18. Typically, first barrier layer is IrO2, and has a thickness 26 in the range of approximately 5 to 50 nm, with the range of 10 to 30 nm being preferred, and a thickness of about 15 nm being optimal.

A second barrier layer 30 is interposed between substrate 12 and first electrode layer 14 to minimize interdiffusion between substrate 12 and electrode layers 14 and 18. Second barrier layer 30 also improves adhesion between substrate 12 and electrode layers 14 and 18. Second barrier layer 30 has a thickness 32 in the range of approximately 10 to 100 nm. Preferably, thickness 32 is in the range of about 20 to 50 nm, and in some aspects of the invention about 25 nm is optimal. Second barrier layer 30 material is selected from the group consisting of Ti, Ta, TiN, TaN, and ternary nitrides including nitrogen and a refractory metal. Typically, the ternary nitride includes a third element selected from the group consisting of Si and Al. For example, TiSiN, TaSiN, and TiAlN.

FIG. 7 illustrates a ferroelectric device of FIG. 6 with a ferroelectric film. A lead germanate (PGO) film 40 overlies first barrier layer 24. Ferroelectric device 10 is formed having low leakage current and a resistance to fatigue. Typically, PGO film 40 is in the range of approximately 10 to 100% $Pb_5Ge_3O_{11}$ phase, whereby the formation of smaller PGO crystal grains is encouraged. In some aspects of the invention, PGO film 40 includes a second, $Pb_3GeO_5$ phase of PGO material, whereby the formation of larger PGO crystal grains is encouraged. In some aspects of the invention, PGO film 40 is epitaxially grown, c-axis $Pb_5Ge_3O_{11}$ phase PGO material. PGO film 40 has a thickness 42 in the range of approximately 50 to 500 nm, with 50 to 300 nm being preferred, and 100 to 200 nm being optimal.

FIG. 8 illustrates ferroelectric device 10 of FIG. 7, wherein a capacitor is formed. Ferroelectric device 10 further comprises a conductive film top electrode 50 overlying PGO film 40. In some aspects of the invention, top electrode 50 further comprises a third electrode layer 52 overlying PGO film 40, and a fourth electrode layer 54 overlying third electrode layer 52, whereby a second layered electrode is formed, in addition to the layered electrode formed by electrode layer 14 and 18.

When a layered top electrode is formed, ferroelectric device 10 typically further comprises a third barrier layer 56 interposed between PGO film 40 and third electrode layer 52. Third barrier layer 56 improves the interface between PGO film 40 and third and fourth electrode layers 52/54. Fourth electrode layer 54 is Ir, while third electrode layer 52 is Pt. Preferably, third barrier layer 56 is $IrO_2$.

Figure 9:
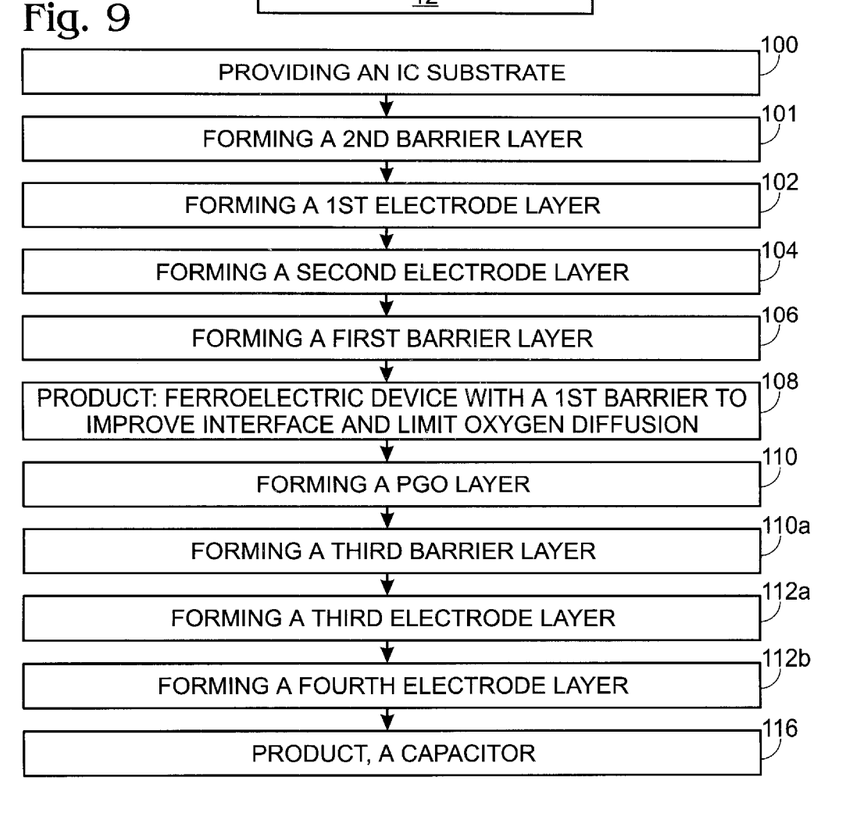
FIG. 9 is a flowchart illustrating steps in a method of forming a ferroelectric device.

FIG. 9 is a flowchart illustrating steps in a method of forming a ferroelectric device. Step 100 provides a substrate. Step 101 forms a second barrier layer overlying the substrate. The second barrier minimizes interdiffusion between the substrate and the electrode layers, while improving adhesion between the substrate and the electrode layers. The second barrier layer material is selected from the group consisting of consisting of Ti, Ta, TiN, TaN, and ternary nitrides including nitrogen and a refractory metal. Typically, the third element of the ternary group is selected from the group consisting of Si and Al. The second barrier thickness is in the range of approximately 10 to 100 nm.

Step 102 forms a first electrode layer overlying the second barrier layer. Step 102 includes depositing Ir to a thickness in the range of approximately 50 to 200 nm. Step 104 forms a second electrode layer overlying the first electrode layer. Step 104 includes depositing Pt to a thickness in the range of approximately 10 to 200 nm. Steps 102 and 104 include depositing Ir and Pt to a combined thickness in the range of approximately 100 to 400 nm. Steps 102 and 104 include depositing the first and second electrode layers through processes selected from the group consisting of e-beam evaporation, CVD, PVD, and MOCVD, at a temperature in the range of approximately room temperature to 500 degrees C.

Step 106 forms a first barrier layer overlying the second electrode layer. Step 106 includes forming the first barrier layer to a thickness in the range of approximately 5 to 50 nm. Step 108 is a product, a ferroelectric device where the barrier layers improve the interface to subsequently deposited layers, and limit the diffusion of oxygen into the first and second electrode layers.

In some aspects of the invention, Step 106 includes annealing the first and second electrode layers in an oxygen ambient atmosphere to form a first barrier layer oxide overlying the second electrode layer. Alternately, Step 106 includes using processes selected from the group consisting of PVD, CVD, and MOCVD to deposit a first barrier layer of $IrO_2$.

In some aspects of the invention, a further step follows Step 106. Step 110 forms a PGO layer overlying the first barrier layer. Step 110 includes depositing PGO film through MOCVD processes at a temperature in the range of approximately 400 to 550 degrees C, and a thickness in the range of approximately 50 to 500 nm. In some aspects of the invention, Step 110 includes the PGO film being in the range of approximately 10 to 100% $Pb_5Ge_3O_{11}$ phase, whereby the formation of smaller PGO crystal grains is encouraged. In some aspects of the invention, Step 110 includes the PGO film having a second, $Pb_3GeO_5$ phase of PGO material, whereby the formation of larger PGO crystal grains is encouraged. The first and second phases are varied depended on desired ferroelectric and ferroelastic characteristics. A large amount of first phase in the PGO film promotes smaller polarization fields, so that the resulting device is useful in one transistor memories. Increasing the amount of second phase increases the Pr value. In some aspects of the invention, Step 110 includes epitaxially growing a c-axis $Pb_5Ge_3O_{11}$ phase PGO material. Step 110 includes forming the PGO film to a thickness in the range of approximately 50 to 500 nm.

Alternate processes exist to form the first barrier layer. Step 106 includes forming $IrO_2$ in preparation for an MOCVD process in Step 110. The stabilization process pre-flows oxygen at a flow rate in the range of approximately 2000 to 4000 sccm, at a growth chamber pressure of approximately 2 to 20 torr (10 is preferred), a substrate temperature in the range of approximately 400 to 550 degrees C, for a duration of approximately 5 to 15 minutes. In this manner, the first barrier layer is formed in situ, just before the PGO film is deposited.

In some aspects of the invention, wherein a capacitor is formed, further steps follow Step 110. Step 112 forms a conductive film top electrode overlying the PGO film. Step 112 optionally includes substeps. Step 112*a* forms a third, Pt electrode layer overlying the PGO film; and Step 112b forms a fourth, Ir electrode layer overlying the third electrode layer, whereby a ferroelectric capacitor is formed. When a layered top electrode is formed in Step 112, a further step follows Step 110. Step 110a forms a third barrier layer of $IrO_2$ overlying the PGO film formed in Step 110, whereby the interface between the PGO film and the third and fourth electrode layers is improved.

Alternately, a further step follows Step 112b. Step 114 (not shown) anneals the third and fourth electrode layers in an oxygen ambient atmosphere. In this manner, Step 110a occurs, in situ, simultaneously with the performance of Step 114. In another alternative Step 110a occurs after Step 110, and before Step 112. Then, Step 110a includes depositing IrO2 through deposition procedures selected from the group consisting of PVD, CVD, and MOCVD. Step 116 is a product, a capacitor having improved fatigue and leakage current properties.

The present invention ferroelectric structure is simply and easily manufactured. The Pt/Ir double-layer is advantageously used with a lead germanate ($Pb_5Ge_3O_{11}$) thin film. Good adhesion to the substrate occurs, and the barrier properties with respect to oxygen and lead are good. Ferroelectric properties are improved without detriment to the leakage current by using this structure, because a thin $IrO_2$ layer is formed in situ, during the MOCVD lead germanate ($Pb_5Ge_3O_{11}$) thin film process. By using a Pt/Ir electrode, a relatively low MOCVD processing temperature is required to achieve c-axis oriented lead germanate ($Pb_5Ge_3O_{11}$) thin film. The temperature range of MOCVD c-axis oriented lead germanate ($Pb_5Ge_3O_{11}$) thin film on top of Pt/Ir is 400–500° C. Further, a relatively large nucleation density is obtained, as compared to using single-layer iridium electrode. Therefore, the lead germanate ($Pb_5Ge_3O_{11}$) thin film has a smooth surface, a homogeneous microstructure, and homogeneous ferroelectric properties.

Further, hillock can be suppressed when a Pt/Ir electrode is used with a PGO film. The sheet resistance is relatively low, compared to single-oxide layer bottom electrodes and oxide/platinum electrodes. Finally, the sheet resistance change for this multilayer electrode is relatively small during annealing, as compared to the single platinum and single iridium electrodes.

The above-mentioned ferroelectric structure is useful in the fabrication of nonvolatile memories, such as metal ferroelectric metal oxide silicon (MFMOS), metal ferroelectric metal silicon (MFMS), metal ferroelectric metal insulator silicon (MFMIS), transistors, capacitors, pyroelectric infrared sensors, optical displays, optical switches, piezoelectric transducers, and surface acoustic wave (SAW) devices. Other variations and embodiments will occur to those skilled in the art.

What is claimed is:

1. A ferroelectric device on a substrate including an electrode and a layer of ferroelectric film on the electrode, the ferroelectric device comprising:
   a layered electrode structure formed on the substrate and disposed between the substrate and the ferroelectric film, said layered electrode structure including:
   a first electrode layer including a noble metal overlying the substrate;
   a second electrode layer including a noble metal overlying said first electrode layer, whereby said first and second electrode layers improve adhesion, barrier properties, and the uniformity of subsequently deposited films;
   a first barrier layer overlying said second electrode layer, whereby said first barrier layer improves the interface to subsequently deposited layers, and limits the diffusion of oxygen into said first and seconds electrode layers; and
   a second barrier layer interposed between said substrate and said first electrode layer, whereby said first and second barrier layers minimize interdiffusion between said substrate and said electrode layers, and adhesion between said substrate and said electrode layers is improved.

2. A ferroelectric device as in claim 1 in which said second barrier layer has a thickness in the range of approximately 10 to 100 nm.

3. A ferroelectric device as in claim 1 in which said second barrier layer material is selected from the group consisting of Ti, Ta, TiN, TaN, and ternary nitrides including nitrogen and a refractory metal.

4. A ferroelectric device as in claim 1 in which said first electrode layer is Ir.

5. A ferroelectric device as in claim 1 in which said second electrode layer is Pt.

6. A ferroelectric device as in claim 1 in which said substrate is selected from the group of materials consisting of silicon, polysilicon, silicon dioxide, and silicon-germanium compounds.

7. A ferroelectric device as in claim 1 in which said first electrode layer has a thickness in the range of approximately 50 to 200 nm, and in which said second electrode layer has a thickness in the range of approximately 10 to 200 nm.

8. A ferroelectric device as in claim 7 in which said first and second electrodes have a combined thickness in the range of approximately 100 to 400 nm.

9. A ferroelectric device as in claim 1 in which said first barrier layer has a thickness in the range of approximately 5 to 50 nm.

10. A ferroelectric device comprising:
    a substrate;
    a first electrode layer including a noble metal overlying said substrate;
    a second electrode layer including a noble metal overlying said first electrode layer, whereby said first and second electrode layers improve adhesion, barrier properties, and the uniformity of subsequently deposited films;
    a first barrier layer overlying said second electrode layer extending between said second electrode layer and the ferroelectric film, whereby said first barrier layer improves the interface to subsequently deposited layers, and limits the diffusion of oxygen into said first and seconds electrode layers;
    a lead germanate (PGO) film overlying said first barrier layer; and
    a second barrier layer interposed between said substrate and said first electrode layer, whereby said first and second barrier layers minimize interdiffusion between said substrate and said electrode layers, and adhesion between said substrate and said electrode layers is improved and whereby a ferroelectric device is formed having low leakage current and a resistance to fatigue.

11. A ferroelectric device as in claim 10, wherein a capacitor is formed, further comprising:
    a conductive film top electrode overlying said PGO film.

12. A ferroelectric device as in claim 11 in which said top electrode further comprises:
    a third electrode layer of Pt overlying said PGO film; and
    a fourth electrode layer of Ir overlying said third electrode layer, whereby a second layered electrode is formed.

13. A ferroelectric device as in claim 12 further comprising:
   a third barrier layer of $IrO_2$ interposed between said PGO film and said third electrode layer, whereby the interface between said PGO film and said third and fourth electrode layers is improved.

14. A ferroelectric device as in claim 13 in which said first barrier material is $IrO_2$.

15. A ferroelectric device as in claim 10 in which said PGO film is in the range of approximately 10 to 100% $Pb_5Ge_3O_{11}$ phase, whereby the formation of smaller PGO crystal grains is encouraged.

16. A ferroelectric device as in claim 15 in which said PGO film includes a second, $Pb_3GeO_5$ phase of PGO material, whereby the formation of larger PGO crystal grains is encouraged.

17. A ferroelectric device as in claim 15 in which said PGO film is epitaxially grown, c-axis $Pb_5Ge_3O_{11}$ phase PGO material.

18. A ferroelectric device as in claim 10 in which said PGO film has a thickness in the range of approximately 50 to 500 nm.

* * * * *